(12) United States Patent
Cuoco et al.

(10) Patent No.: US 12,009,792 B2
(45) Date of Patent: Jun. 11, 2024

(54) POWER AMPLIFIER WITH DECREASED RF RETURN CURRENT LOSSES

(71) Applicant: Ampleon Netherlands B.V., Nijmegen (NL)

(72) Inventors: Vittorio Cuoco, Nijmegen (NL); Jos Van Der Zanden, Nijmegen (NL); Yi Zhu, Nijmegen (NL); Iouri Volokhine, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 633 days.

(21) Appl. No.: 17/272,814

(22) PCT Filed: Sep. 3, 2019

(86) PCT No.: PCT/NL2019/050571
§ 371 (c)(1),
(2) Date: Mar. 2, 2021

(87) PCT Pub. No.: WO2020/050719
PCT Pub. Date: Mar. 12, 2020

(65) Prior Publication Data
US 2021/0257977 A1 Aug. 19, 2021

(30) Foreign Application Priority Data
Sep. 3, 2018 (NL) .................................... 2021545

(51) Int. Cl.
*H03F 3/24* (2006.01)
*H01L 23/00* (2006.01)
(Continued)

(52) U.S. Cl.
CPC ............. *H03F 3/245* (2013.01); *H01L 23/66* (2013.01); *H01L 24/49* (2013.01); *H03F 3/195* (2013.01);
(Continued)

(58) Field of Classification Search
CPC .... H03F 3/245; H03F 3/195; H03F 2200/451; H03F 2200/222; H03F 2200/387;
(Continued)

(56) References Cited

U.S. PATENT DOCUMENTS

| 9,653,410 B1 | 5/2017 | Holmes et al. |
| 2018/0047656 A1 | 2/2018 | Mkhitarian et al. |

(Continued)

OTHER PUBLICATIONS

PCT International Search Report and Written Opinion, Application No. PCT/NL2019/050571, dated Nov. 15, 2019, 13 pages.

*Primary Examiner* — Kyoung Lee
*Assistant Examiner* — Christina A Sylvia
(74) *Attorney, Agent, or Firm* — McDonnell Boehnen Hulbert & Berghoff LLP (57) ABSTRACT

Example embodiments relate to power amplifiers with decreased RF return current losses. One embodiment includes a RF power amplifier package that includes a semiconductor die, an input lead, first bondwire connections, second bondwire connections, and a plurality of shields. The semiconductor die includes an RF power transistor that includes output bond pads, input bond pads, a plurality of input fingers, and a plurality of output fingers. Further, each shield of the plurality of shields is arranged in between a respective input finger of the plurality of input fingers and a respective output finger of the plurality of output fingers and extending along with said respective input finger and output finger. In addition, each shield of the plurality of shields is connected to a ground terminal of the RF power transistor. The input fingers, output fingers, and shields are formed using a metal layer stack of multiple metal layers.

17 Claims, 6 Drawing Sheets

(51) Int. Cl.
*H01L 23/66* (2006.01)
*H03F 3/195* (2006.01)

(52) U.S. Cl.
CPC ............ *H01L 2223/6611* (2013.01); *H01L 2223/6655* (2013.01); *H01L 2224/04042* (2013.01); *H01L 2224/49175* (2013.01); *H03F 2200/451* (2013.01)

(58) Field of Classification Search
CPC ......... H01L 23/66; H01L 24/49; H01L 24/48; H01L 2223/6611; H01L 2223/6655; H01L 2223/665; H01L 2223/6683; H01L 2224/04042; H01L 2224/49175; H01L 2224/05553; H01L 2224/48229; H01L 2224/48247; H01L 2224/49111
See application file for complete search history.

(56) References Cited

U.S. PATENT DOCUMENTS

| | | | |
|---|---|---|---|
| 2019/0181106 A1* | 6/2019 | Heeres | H01L 23/66 |
| 2022/0254762 A1* | 8/2022 | Watts | H01L 23/66 |
| 2023/0105193 A1* | 4/2023 | Zhu | H03F 3/195 |
| | | | 330/295 |
| 2023/0216452 A1* | 7/2023 | Vaswani | H03F 3/19 |
| | | | 330/307 |

* cited by examiner

POWER AMPLIFIER WITH DECREASED RF RETURN CURRENT LOSSES

CROSS-REFERENCE TO RELATED APPLICATIONS

The present application is a national stage entry of PCT/NL2019/050571 filed Sep. 3, 2019, which claims priority to NL 2021545 filed on Sep. 3, 2018, the contents of each of which are hereby incorporated by reference.

BACKGROUND

The present invention is related to a radiofrequency 'RF' power amplifier package and to an electronic device comprising the same.

RF power amplifier packages are often used in base stations for mobile telecommunications. In these packages one or more RF power transistors are arranged on a substrate that is mostly copper based. Leads are provided on opposite ends of the package to allow signals to enter and leave the package. These leads are arranged spaced apart from the substrate by a separating member such as a ceramic ring or a solidified molding compound.

RF power amplifier packages are often characterized by several parameters. Examples of such parameters are the power added efficiency and gain. These parameters are strongly influenced by the losses that signals experience after having been amplified by the RF power transistors.

It is known that the losses associated with RF return currents have a non-negligible influence on both gain and efficiency. These losses are relevant for both the input signal, i.e. the signal that is fed to the input of the RF power transistor, and the output signal, i.e. the signal that is outputted by the RF power transistor.

US 2018/047656A1 discloses an RF power amplifier package as defined by the preamble of claim 1.

SUMMARY

It is an object of the present invention to provide an improvement in gain and efficiency of RF power amplifier packages by lowering the losses that are associated with RF return currents.

According to the invention, this object has been achieved with the RF power amplifier package according to claim 1, which includes a semiconductor die comprising an RF power transistor. The RF power transistor comprises output bond pads, input bond pads, a plurality of input fingers that are connected to the input bond pads, a plurality of output fingers that are connected to the output bond pads, and a plurality of shields, each shield being arranged in between a respective input and output finger and extending along therewith, wherein the shields are connected to a ground terminal of the RF power transistor. Shields are often used in RF power transistors and allow for an increase of the maximum voltage between the input and output of the RF power transistor. The input fingers, the output fingers, and the shields are each formed using a metal layer stack of multiple metal layers of which upper metal layers have a larger thickness than lower metal layers.

The RF power transistor may for example comprise a field-effect transistor 'FET', such as a GaN-based FET or a Si-based LDMOS transistor. These transistors each have a gate as input, a drain as output, and a source as ground terminal.

The RF power amplifier package according to the invention further comprises an input lead arranged on an input side of the package and an output lead arranged on an output side of the package. First bondwire connections extend from the input bond pads towards the input side of the package and connect, either directly or indirectly, the input bond pads to the input lead. Similarly, second bondwire connections extend from the output bond pads towards the output side of the package and connect, either directly or indirectly, the output bond pads to the output lead.

According to the invention, the package is characterized in that each input finger physically extends for a larger part in a region in between the input side of the package and the input bond pads than in a region in between the input bond pads and the output side of the package and/or in that each output finger physically extends for a larger part in a region in between the output bond pads and the output side of the package than in a region in between the input side of the package and the output bond pads.

The Applicant has found that in prior art devices the larger part of the RF return current does not flow in the upper metal layers in which the fingers and shields are realized. Consequently, the losses associated with the RF return current are higher than would be the case if the RF return current would flow through the thicker upper metal layers.

To solve the abovementioned problem, the invention proposes to change the positioning of the bondwires that are responsible for carrying the signal to be amplified from the input lead(s) to the input bond pads and/or to change the positioning of the bondwires that are responsible for carrying the amplified signal from the output bond pads to the output lead(s). More in particular, whereas in prior art devices these bondwires do not or hardly extend above the RF power transistor, the present invention proposes to intentionally introduce an electromagnetic coupling between the RF power transistor and these bondwires to pull the RF return current upwards toward the higher and thicker metal layers.

To reduce the RF return current losses that are associated with the input signal that is fed to the input of the RF power transistor, each input finger can be configured to physically extend for a larger part in a region in between the input side of the package and the input bond pads than in a region in between the input bond pads and the output side of the package. In prior art devices, the input bond pads are positioned near the edge of the semiconductor die that is nearest to the input side of the package. According to one aspect of the invention, the losses associated with the input signal can be reduced by shifting the input bond pads towards the opposite edge of the semiconductor die, whereas the position of the input fingers is not or hardly changed with respect to prior art devices. The abovementioned shift of the input bond pads forces the bondwires that connect to the input bond pads to extend for a larger part over the input fingers. The electromagnetic coupling arising from this orientation of the bondwires relative to the input fingers causes the RF return current to flow through the upper and thicker metal layers. Similarly, to reduce the RF return current losses that are associated with the output signal that is extracted from the output of the RF power transistor, each output finger can be configured to physically extend for a larger part in a region in between the output side of the package and the output bond pads than in a region in between the output bond pads and the input side of the package. In prior art devices, the output bond pads are positioned near the edge of the semiconductor die that is nearest to the output side of the package. According to one aspect of the invention, the losses associated with the output signal can be reduced by shifting the output bond pads towards the opposite edge of the semiconductor die, whereas the position of the output fingers is not or hardly changed with respect to prior art devices. The abovementioned shift of the output bond pads forces the bondwires that connect to the output bond pads to extend for a larger part over the output fingers. The electromagnetic coupling arising from this orientation of the bondwires relative to the output fingers causes the RF return current to flow through the upper and thicker metal layers.

The skilled person will readily understand that changing the positioning of the output bond pads and input bond pads can be implemented substantially independently. Moreover, the present invention does not exclude embodiments wherein only the output bond pads or only the input bond pads are shifted relative to prior art devices.

It is further noted that when the RF power transistor is a FET, the input bond pads are referred to as gate bond pads and the output bond pads as drain bond pads.

In an embodiment, each input finger physically extends for more than 70% in the region in between the input side of the package and the input bond pads, preferably more than 90%. Additionally or alternatively, each output finger may physically extend for more than 70% in the region in between the output bond pads and the output side of the package, preferably more than 90%.

In an embodiment, the output bond pads are arranged nearer to the edge of the semiconductor die that is closest to the input side of the package. This positioning of the output bond pads may require that the input fingers extend below the output bond pads. For example, the output bond pads may be formed in the upper metal layer(s) whereas the input fingers at the position of the output bond pads are formed only in the lower metal layer(s) allowing the input fingers to pass underneath the output bond pads. Additionally or alternatively, the input bond pads may be formed in the upper metal layer(s) whereas the output fingers at the position of the input bond pads are formed only in the lower metal layer(s) allowing the output fingers to pass underneath the input bond pads. Similar considerations hold when the input bond pads are arranged nearer to the edge of the semiconductor die that is closest to the output side of the package.

The RF power transistor may further comprise auxiliary output bond pads that are arranged on the semiconductor die and in between the output bond pads and the output side. In this case, the second bondwire connections comprise a plurality of first output bondwires that extend between the output bond pads and the auxiliary output bond pads and a plurality of second output bondwires that extend from the auxiliary output bond pads towards the output lead. By using auxiliary output bond pads, the maximum bondwire length can be reduced. The auxiliary output bond pads are preferably not directly coupled to the output fingers, only indirectly via the first output bondwires and output bond pads.

In an embodiment, the input bond pads are arranged nearer to the edge of the semiconductor die that is closest to the output side of the package. Similar considerations hold for the routing of the output and input fingers near the input bond pads as described above in conjunction with routing near the output bond pads. The RF power amplifier package may further comprise auxiliary input bond pads arranged on the semiconductor die and in between the input bond pads and the input side. In this case, the first bondwire connections comprise a plurality of first input bondwires that extend from the auxiliary input bond pads towards the input side and a plurality of second input bondwires that extend between the auxiliary input bond pads and the input bond pads.

The RF power amplifier package may further comprise a DC blocking capacitor having a first terminal and a second grounded terminal, and one or more resonance bondwires connected in between the output bond pads and the first terminal of the DC blocking capacitor. The DC blocking capacitor essentially forms a short at an RF operating frequency of the RF power amplifier package, such as in between 500 MHz and 5 GHz. Moreover, the inductance of the one or more resonance bondwires is designed such that it resonates with an output capacitance of the RF power transistor at or close to the RF operating frequency. Hence, at or close to the operating frequency, a relatively high impedance to ground is formed by the parallel combination of the output capacitance and the inductance of the one or more resonance bondwires. The impact of the output capacitance on the overall behavior at or close to the operating frequency can thereby be mitigated.

The DC blocking capacitor can be arranged in between the semiconductor die and the output lead. For example, the DC blocking capacitor can be realized in the form of a discrete component and/or using a semiconductor die on which the DC blocking capacitor is realized. Alternatively, the DC blocking capacitor can be arranged on the semiconductor die. More in particular, the DC blocking capacitor can be arranged nearer to edge of the semiconductor die that is closest to the input side of the package and each output finger may physically extend for a larger part in the region in between the input side of the package and the output bond pads than in the region in between the output bond pads and the output side of the package.

Alternatively, the DC blocking capacitor is arranged nearer to edge of the semiconductor die that is closest to the output side of the package, wherein each output finger may physically extend for a larger part in a region in between the output bond pads and the output side of the package than in a region in between the input side of the package and the output bond pads.

The first bondwire connections may connect directly to the input lead. Alternatively, the RF power amplifier package may further comprise an input matching network arranged in between the input lead and the semiconductor die, wherein the first bondwire connections comprise third input bondwires that extend between the input lead and the input matching network and fourth input bondwires that extend between the input matching network and the input bond pads. Here, the fourth input bondwires may correspond to the first input bondwires in case an auxiliary input bond pad is used. The input matching network may comprise an input matching capacitor having a first terminal and a grounded second terminal, wherein the third input bondwires and the fourth input bondwires are each connected to the first terminal of the input matching capacitor.

The second bondwire connections may connect directly to the output lead. Alternatively, the RF power amplifier package may further comprise an output matching network arranged in between the output lead and the semiconductor die, wherein the second bondwire connections comprise fourth output bondwires that extend between the output lead and the output matching network and third output bondwires that extend between the output matching network and the output bond pads. Here, the third output bondwires may correspond to the second output bondwires in case an auxiliary output bond pad is used.

The output matching network may comprise an output matching capacitor having a first terminal and a grounded second terminal, wherein the third output bondwires and the fourth output bondwires are each connected to the first terminal of the output matching capacitor.

The input bond pads may be grouped into an input bond bar, and/or the output bond pads into an output bond bar, the auxiliary output bond pads into an auxiliary output bond bar, and/or the auxiliary input bond pads into an auxiliary input bond bar.

The RF power amplifier package may further comprise a conductive substrate on which the semiconductor die, the input capacitor, the output capacitor, and/or DC blocking capacitor are mounted, and wherein, if applicable, the second terminal of the input capacitor, the second terminal of the output capacitor, and/or second terminal of the DC blocking capacitor may be connected to the conductive substrate. Additionally or alternatively, the ground terminal of the RF power transistor may be connected to the substrate via the conductive substrate of the semiconductor die.

According to a further aspect, the present invention provides an electronic device comprising the RF power amplifier package as described above.

BRIEF DESCRIPTION OF THE DRAWINGS

Next, the invention will be described in more detail referring to the appended drawings, wherein.

Hereinafter, when bondwires are shown, it should be noted that not all of the bondwires may be shown to improve the clarity of the figures. For example, instead of a large plurality of output bondwires only two or three will be shown. The same holds for the number of gate fingers and drain fingers that will be depicted.

DETAILED DESCRIPTION

Figure 1:
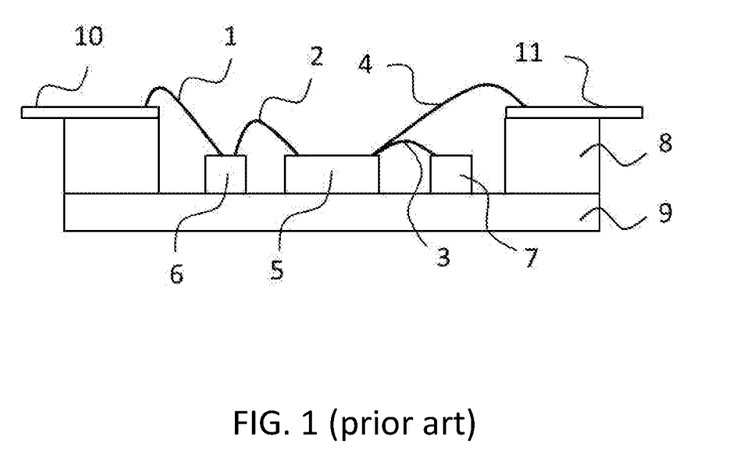
FIG. 1 illustrates a cross section of a known radiofrequency power amplifier package.
Figure 2:
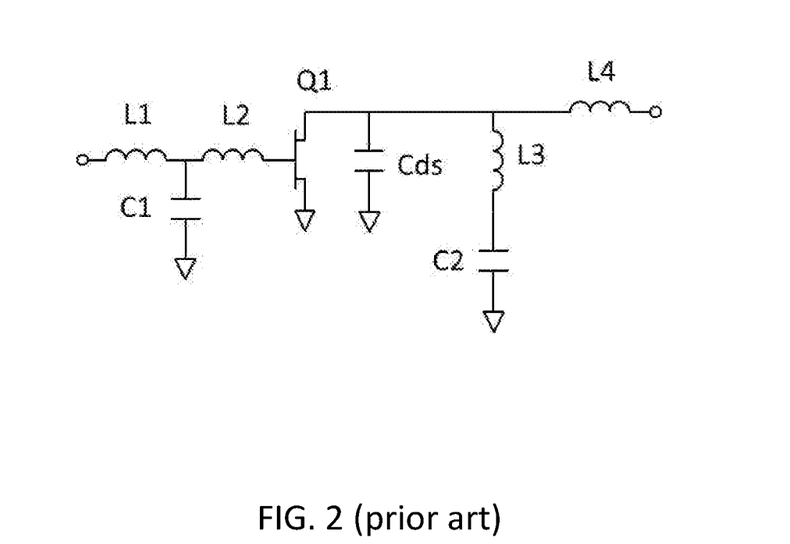
FIG. 2 illustrates an equivalent circuit of the radiofrequency power amplifier package of FIG. 1.

FIG. 1 illustrates a known RF power amplifier package. FIG. 2 illustrates an electric circuit corresponding to the package of FIG. 1. As shown, the RF package comprises a semiconductor die 5 on which an RF power transistor Q1 is arranged. Here, transistor Q1 can be a Si based LDMOS transistor or a GaN field effect transistor that is suitable for generating high power levels (>5W) at frequencies above 500 MHz.

Semiconductor die 5 is mounted on a conductive substrate 9. The RF package further comprises an input lead 10 and an output lead 11 which are each separated from substrate 9 using a spacer element 8 for example in the form of a ceramic ring.

Input lead 10 is connected to a matching network formed by bondwire(s) 1, bondwire(s) 2, and a capacitor 6 to ground. Bondwire(s) 2 are connected to an input, e.g. gate, of transistor Q1 and bondwire(s) 1 are connected to input lead 10. Furthermore, bondwires(s) 1 correspond to inductance L1, bondwire(s) 2 to inductance L2, and capacitor 6 to capacitor C1 in FIG. 2. Capacitor 6 may be in the form of a passive semiconductor die comprising one terminal to which bondwire(s) 1, 2 are connected and which is arranged at an upper surface of the die. Capacitor 6 further comprises another terminal at the backside of the die contacting the conductive substrate 9.

Transistor Q1 comprises an output capacitance Cds as shown in FIG. 2. As this capacitance may become large for high power transistors, it may have a detrimental influence on RF performance. To mitigate this problem it is known to arrange an inductance parallel to Cds, such as inductor L3 in FIG. 2. This inductance is generally configured to resonate with Cds at or close to an operational frequency of the amplifier to effectively present a high impedance at the output of Q1. A DC blocking capacitor, such as capacitor C2, is arranged in series with L3 to block a DC path to ground.

The abovementioned functionality is implemented in the RF package of FIG. 1. For example, inductance L3 is formed using bondwire(s) 3 and capacitor C2 by a passive semiconductor die 7 that is similar to passive semiconductor die 6. Here, bondwires(s) 3 extend from an output of Q1, e.g. drain, to an upper terminal of C2. The other terminal of C2 may be arranged on a backside of passive semiconductor die 6. The output of Q1 is further connected to output lead 11 using bondwire(s) 4, which are represented by inductor L4 in FIG. 2.

Figure 3:
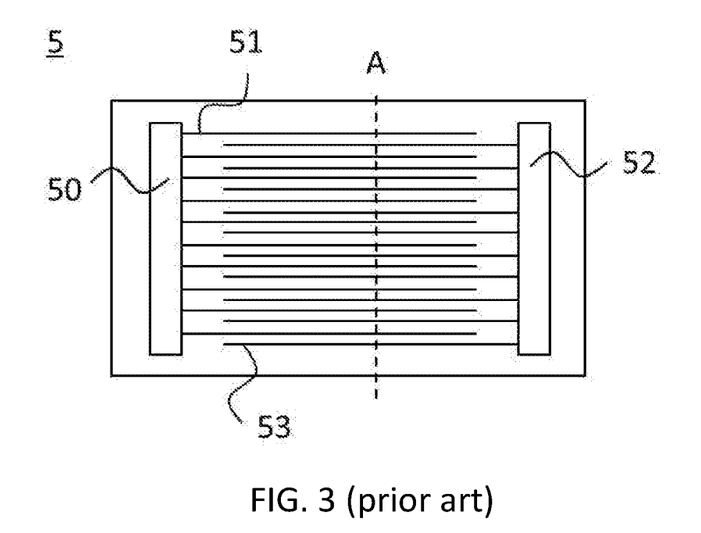
FIG. 3 illustrates a top view of a semiconductor die comprising a known RF power transistor that can be used in the topology in FIG. 1.

FIG. 3 schematically illustrates a top view of semiconductor die 5. Here, a gate bar 50 is formed to which bondwire(s) 2 are bonded (not shown). Similarly, at the output side, a drain bar 52 is formed to which bondwire(s) 3, 4 are bonded (not shown). Gate fingers 51 extend from gate bar 50 towards an output side of the package. Here, the output side of the package corresponds to the side of the package where output lead 11 is arranged. Drain fingers 53 extend from drain bar 52 towards an input side of the package, wherein the input side of the package corresponds to the side of the package where input lead 10 is arranged.

Figure 4:
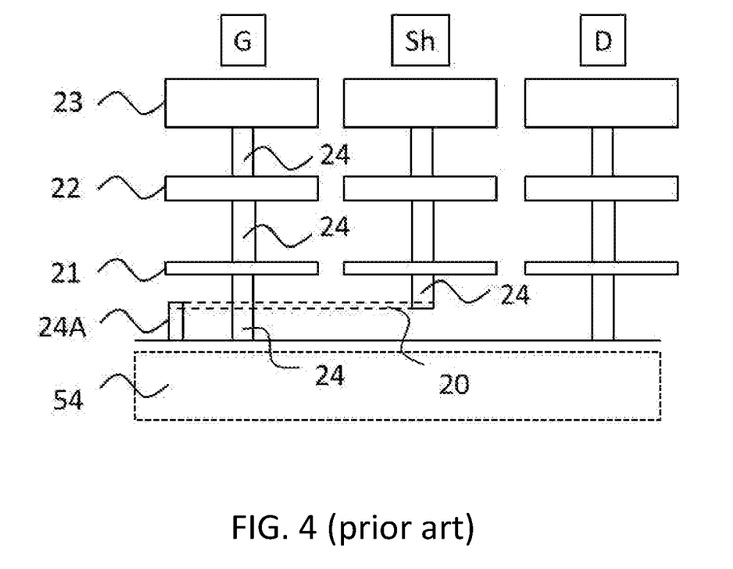
FIG. 4 illustrates a schematic cross section of the semiconductor die along line A shown in FIG. 3.

FIG. 4 schematically illustrates a cross section of semiconductor die 5 in a plane perpendicular to gate fingers 51. In FIG. 4, the position of the layers in semiconductor die 5 making up transistor Q1 is indicated by dotted rectangle 54. Furthermore, it is shown that gate fingers 51 and drain fingers 53 are each formed using a layer stack of one or more metals. Furthermore, FIG. 4 illustrates that the actual drain and gate connections on the semiconductor die are connected, using vias 24, 24A, to the various layers 20-23 of the metal stack. In this metal stack, the upper metal layers are considerably thicker than the lower metal layers.

FIG. 4 illustrates that gate finger G is formed using metal layers 21-23. In each layer, a finger such as illustrated in FIG. 3 may extend along semiconductor die 5. Alternatively, a finger may only extend in the upper metal layers. A similar arrangement holds for the drain finger D that may also comprise one or more fingers at specific metal layers.

FIG. 4 further illustrates that one or more shields Sh are arranged in between the gate and drain fingers. These shields are grounded. More in particular, FIG. 4 illustrates how shield Sh is connected via a track on metal layer 20 and via 24A to the source of the transistor. Furthermore, the source of transistor Q1 is electrically connected via a highly doped region ('plug', not shown) in semiconductor die 5 to conductive substrate 9.

Any current that leaves or enters a gate or drain terminal of transistor Q1 is associated with a return current. These return currents typically flow for a large part through shields Sh.

The Applicant has found that when using the topology of FIG. 3, a significant amount of the RF return current is not flowing through the upper metal layers of shield Sh. Instead, the return current flows through the lower metal layers. Due to the fact that these lower layers are thinner than the upper metal layers, losses may be higher.

Figure 5:
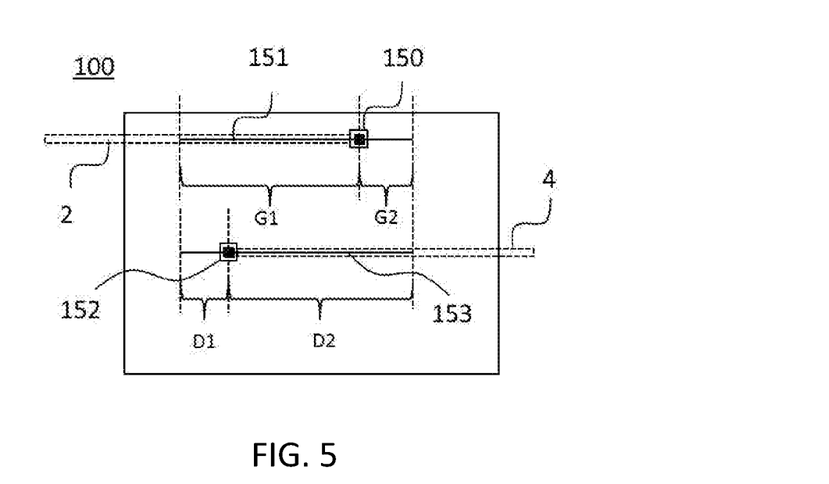
FIG. 5 illustrates a general aspect of the invention.

A general solution of this problem in accordance with the present invention is shown in FIG. 5, which presents a partial top view of semiconductor die 100. Compared with the topology shown in FIG. 3, the positions at which the bondwires are connected to the semiconductor die has changed. More in particular, gate finger 2 extends over a length G1 from bondpad 150 towards the input side (left-hand side in FIG. 5) and extends over a length G2 from bondpad 150 towards the output side (right-hand side in FIG. 5). Similarly, drain finger 4 extends over a length D1 from bondpad 152 towards the input side and extends over a length D2 from bondpad 152 towards the output side.

According to the invention, at least one of the following conditions holds for the gate fingers and drain fingers: G1>G2 and D2>D1. The Applicant has found that when D2>D1, a larger part of the return current associated with the drain current flows through the upper metal layers of Shield Sh, thereby lowering losses associated with this return current when compared with the topology of FIG. 3. The Applicant further found that when G1>G2, a larger part of the return current associated with the gate current flows through the upper metal layers of Shield Sh, thereby lowering losses associated with this return current when compared with the topology of FIG. 3.

Figure 6A:
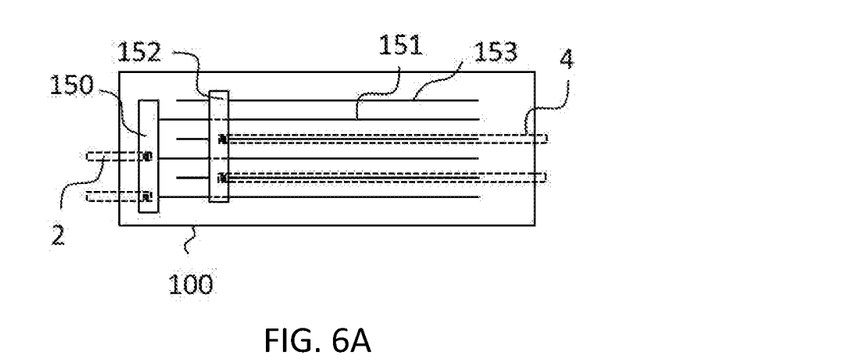
FIGS. 6A-6I illustrate various embodiments of the invention.

FIGS. 6A-6I illustrate various examples of reducing the losses associated with the drain and/or gate currents. In FIG. 6A, an example is presented wherein the drain bondpads are grouped in a drain bondbar 152 which is positioned in correspondence with FIG. 5, whereas the gate bondpads are grouped in a gate bondbar 150 which is positioned in correspondence with the prior art topology of FIG. 3.

As can be seen in FIG. 6A, gate fingers 151 extend underneath drain bondbar 152. This is indicated by the dashed portion. Such routing is made possible by using the multi-layer metal stack as discussed above.

Figure 6B:
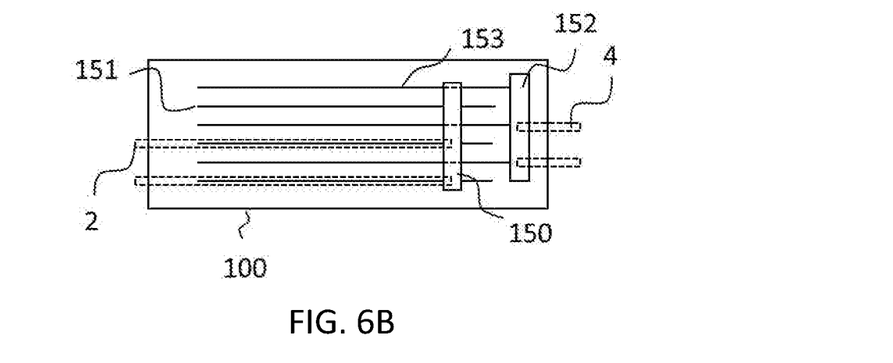

In FIG. 6B, an example is presented wherein the gate bondpads are grouped in a gate bondbar 150 which is positioned in correspondence with FIG. 5, whereas the drain bondpads are grouped in a drain bondbar 152 which is positioned in correspondence with the prior art topology of FIG. 3. As can be seen in FIG. 6B, drain fingers 153 extend underneath gate bondbar 150.

Figure 6C:
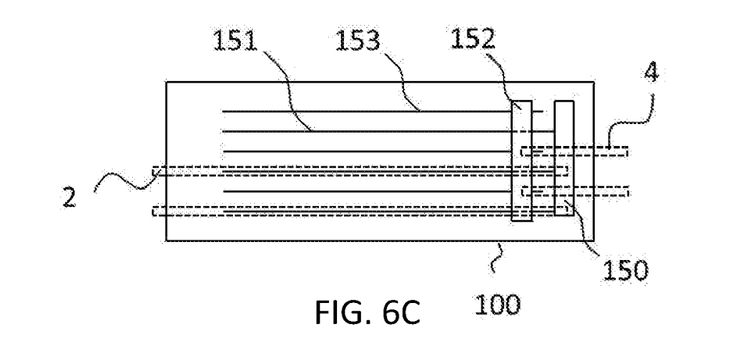

It should be noted that when the drain bondbar 152 and gate bondbar 150 are arranged close to each other, such as illustrated in FIGS. 6A and 6B, it may equally be possible to reverse the order of the bondbars. In this way, intentional coupling between bondwires 2, 4 may or may not be generated. An example thereof is indicated in FIG. 6C. In this figure, gate bondbar 150 is arranged in between drain bondbar 152 and the output side of the package.

Figure 6D:
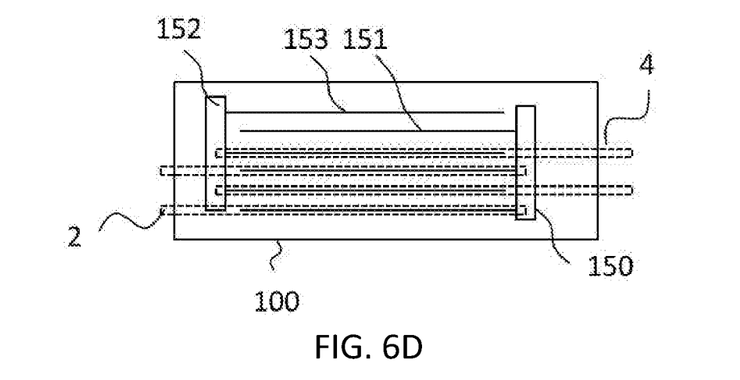
Figure 6E:
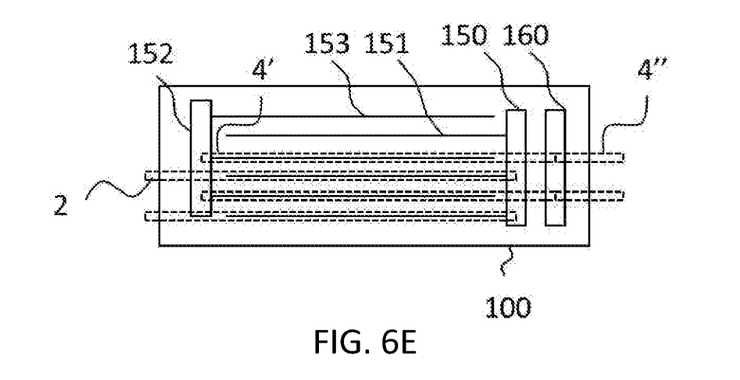

FIG. 6D illustrates an embodiment corresponding to FIG. 5. In this embodiment, there may be a relatively large electromagnetic coupling between bondwires 2, 4, which may be advantageously for tuning the amplifier for stability.

Depending on the placement of the bondbars, the length of the connecting bondwires 2, 4 may become large. It may then be advantageous to arrange auxiliary bondbars or bondpads on the semiconductor die. An example thereof is present in FIG. 6E, where an auxiliary drain bondbar 160 is used to divide bondwire 4 in a primary part 4' and a secondary part 4". The arrangement of bondbars 150, 152 in this embodiment is similar to the arrangement shown in FIG. 6D.

Figure 6F:
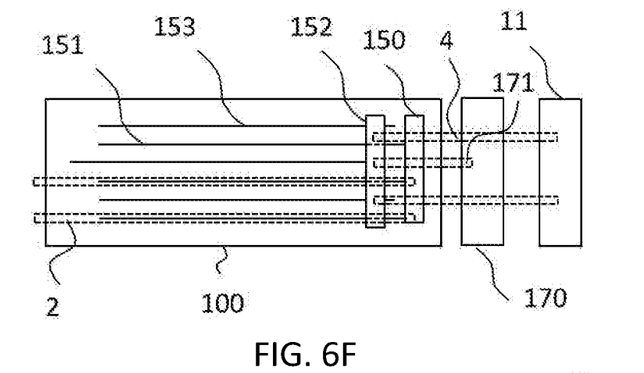
Figure 6G:
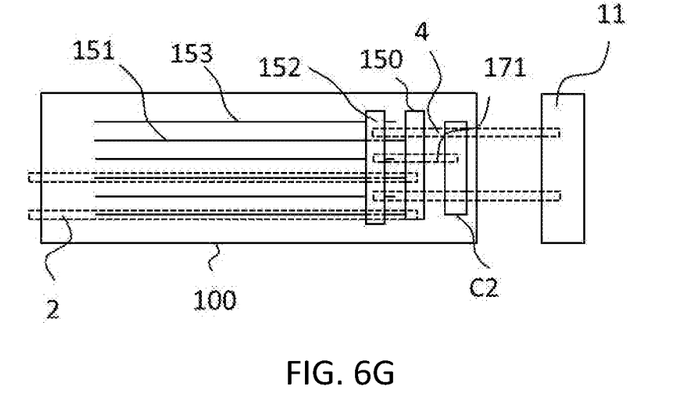
Figure 6H:
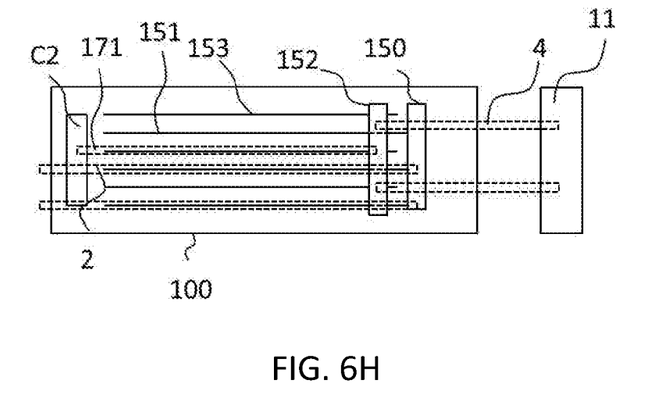

The embodiments shown in FIGS. 6F-6H illustrate embodiments, wherein an inductor is used to resonate with the output capacitance of the transistor, similar to the circuit shown in FIG. 2. In FIG. 6F, a separate semiconductor die 170 is shown on which a DC blocking capacitor C2 is integrated. Other means of realizing DC blocking capacitor C2 are not excluded. Bondwire(s) 171 extend between drain bondbar 152 and one terminal of capacitor C2. Similar to FIG. 1, the other terminal of C2 is arranged on the backside of die 170.

Instead of using a separate semiconductor die 170, C2 may be integrated in semiconductor die 100 itself. This is illustrated in FIG. 6G. Another example of such integration is shown in FIG. 6H, wherein C2 is positioned on an opposite side of the semiconductor die 100 as drain bondbar 152.

Figure 6I:
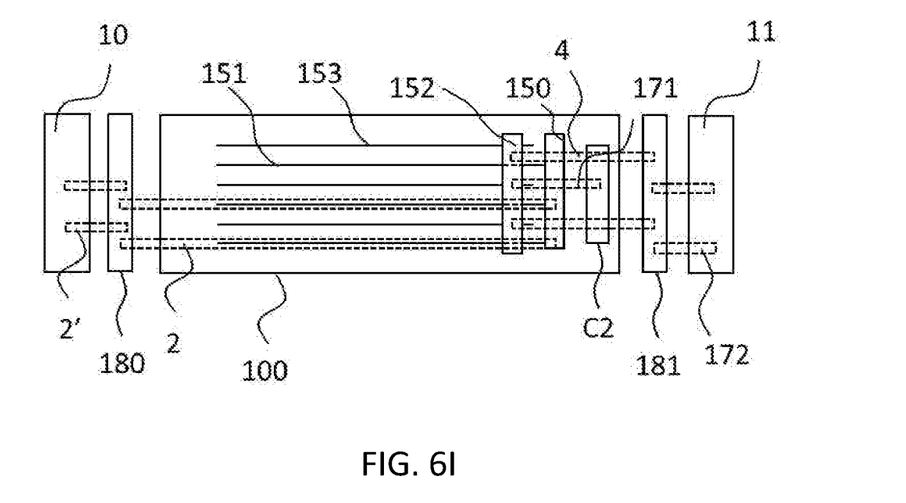
Figure 6J:
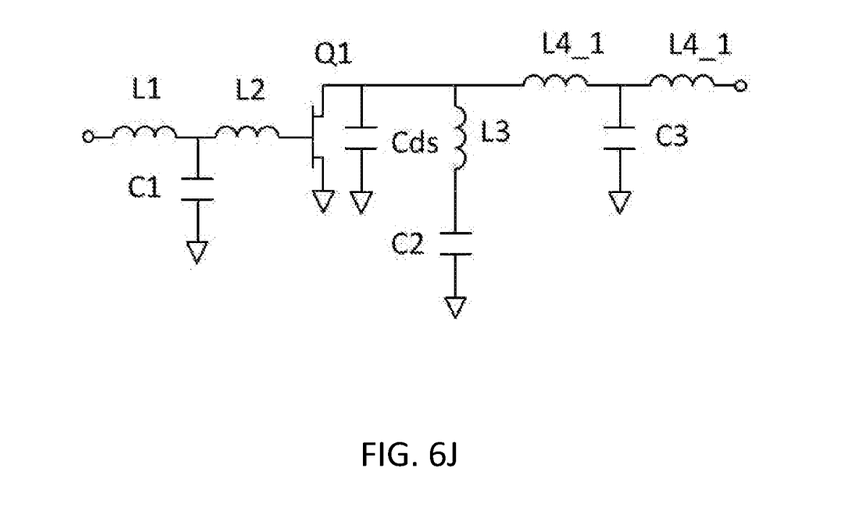
FIG. 6J illustrates an equivalent circuit corresponding to the embodiment of FIG. 6I.

FIG. 6I illustrates an input matching network and an output matching network connected to semiconductor die 100. An equivalent circuit is shown in FIG. 6J. Each matching network comprises a capacitor C1, C3 to ground realized in a semiconductor die 180, 181, respectively, and two inductors in series. For example, an input matching network is formed by an inductor L1 formed by bondwires 2', the capacitor to ground C1 formed on semiconductor die 180, and an inductor L2 formed by bondwires 2. Similarly, an output matching network is formed by an inductor L4_1 formed by bondwires 4, the capacitor to ground C3 formed on semiconductor die 181, and an inductor L4_2 formed by bondwires 172. Furthermore, in FIG. 6I, bondwires 171 correspond to inductor L3.

Although the FIG. 6I embodiment discloses that gate bondbar 150 is arranged close to the output side than to the input side, the skilled person will readily understand that the topology of FIG. 6I can be combined with any of the embodiments 6A-6H.

In the description above, the present invention has been explained using detailed embodiments thereof. It should however be noted that the present invention is not limited to these embodiments. Modifications to the embodiments can be made without departing from the scope of the invention, which is defined by the appended claims and their equivalents.

The invention claimed is:

1. A radio-frequency (RF) power amplifier package comprising:
   a semiconductor die comprising;
      an RF power transistor comprising:
         a plurality of output bond pads;
         a plurality of input bond pads;
         a plurality of input fingers that are connected to the plurality of input bond pads; and
         a plurality of output fingers that are connected to the plurality of output bond pads;
   an input lead arranged on an input side of the RF power amplifier package and an output lead arranged on an output side of the RF power amplifier package;
   a plurality of first bondwire connections extending from the plurality of input bond pads towards the input side of the RF power amplifier package and connecting, either directly or indirectly, the plurality of input bond pads to the input lead;

a plurality of second bondwire connections extending from the plurality of output bond pads towards the output side of the RF power amplifier package and connecting, either directly or indirectly, the plurality of output bond pads to the output lead; and
a plurality of shields, each shield of the plurality of shields being arranged in between a respective input finger of the plurality of input fingers and a respective output finger of the plurality of output fingers and extending along with said respective input finger and output finger,
wherein each shield of the plurality of shields is connected to a ground terminal of the RF power transistor,
wherein each input finger of the plurality of input fingers, each output finger of the plurality of output fingers, and each shield of the plurality of shields are formed using a metal layer stack of multiple metal layers of which upper metal layers have a greater thickness than lower metal layers, and
wherein:
each input finger of the plurality of input fingers physically extends for a larger part in a region in between the input side of the RF power amplifier package and the plurality of input bond pads than in a region in between the plurality of input bond pads and the output side of the RF power amplifier package, wherein each input finger of the plurality of input fingers physically extends for more than 70% in the region in between the input side of the RF power amplifier package and the plurality of input bond pads, preferably more than 90%; and/or
each output finger of the plurality of output fingers physically extends for a larger part in a region in between the plurality of output bond pads and the output side of the RF power amplifier package than in a region in between the input side of the RF power amplifier package and the plurality of output bond pads, wherein each output finger of the plurality of output fingers physically extends for more than 70% in the region in between the plurality of output bond pads and the output side of the RF power amplifier package, preferably more than 90%.

2. The RF power amplifier package according to claim 1, wherein the plurality of input bond pads is grouped into an input bond bar, and wherein the plurality of output bond pads is grouped into an output bond bar.

3. The RF power amplifier package according to claim 2, wherein each output finger that is connected to the output bond bar corresponds to a respective output finger of the plurality of output fingers, and wherein each input finger that is connected to the input bond bar corresponds to a respective input finger of the plurality of input fingers.

4. The RF power amplifier package according to claim 2, wherein the plurality of output fingers extends underneath the input bond bar or the plurality of input fingers extends underneath the output bond bar.

5. The RF power amplifier package according to claim 1,
wherein the plurality of output bond pads is arranged nearer to an edge of the semiconductor die that is closest to the input side of the RF power amplifier package,
wherein the RF power transistor preferably further comprises a plurality of auxiliary output bond pads arranged on the semiconductor die and in between the plurality of output bond pads and the output side,
wherein the second bondwire connections comprise a plurality of first output bondwires that extend between the plurality of output bond pads and the plurality of auxiliary output bond pads and a plurality of second output bondwires that extend from the plurality of auxiliary output bond pads towards the output lead, and
wherein the plurality of auxiliary output bond pads is preferably grouped into an auxiliary output bond bar.

6. The RF power amplifier package according to claim 5, further comprising an output matching network arranged in between the output lead and the semiconductor die,
wherein the second bondwire connections comprise a plurality of fourth output bondwires that extend between the output lead and the output matching network and a plurality of third output bondwires that extend between the output matching network and the plurality of output bond pads or the plurality of auxiliary output bond pads,
wherein the output matching network preferably comprises an output matching capacitor having a first terminal and a grounded second terminal, and
wherein the plurality of third output bondwires and the plurality of fourth output bondwires are each connected to the first terminal of the output matching capacitor.

7. The RF power amplifier package according to claim 6, further comprising a conductive substrate on which the semiconductor die is mounted,
wherein the output matching capacitor is mounted on the conductive substrate,
wherein the grounded second terminal of the output matching capacitor is preferably connected to the conductive substrate, and
wherein the ground terminal of the RF power transistor is preferably connected to a substrate via the conductive substrate of the semiconductor die.

8. The RF power amplifier package according to claim 1,
wherein the plurality of input bond pads are arranged nearer to an edge of the semiconductor die that is closest to the output side of the RF power amplifier package,
wherein the RF power transistor preferably further comprises a plurality of auxiliary input bond pads arranged on the semiconductor die and in between the plurality of input bond pads and the input side,
wherein the first bondwire connections comprise a plurality of first input bondwires that extend from the plurality of auxiliary input bond pads towards the input side and a plurality of second input bondwires that extend between the plurality of auxiliary input bond pads and the plurality of input bond pads, and
wherein the plurality of auxiliary input bond pads is preferably grouped into an auxiliary input bond bar.

9. The RF power amplifier package according to claim 8, further comprising an input matching network arranged in between the input lead and the semiconductor die,
wherein the first bondwire connections comprise a plurality of third input bondwires that extend between the input lead and the input matching network and a plurality of fourth input bondwires that extend between the input matching network and the plurality of input bond pads or the plurality of auxiliary input bond pads,
wherein the input matching network preferably comprises an input matching capacitor having a first terminal and a grounded second terminal, and
wherein the plurality of third input bondwires and the plurality of fourth input bondwires are each connected to the first terminal of the input matching capacitor.

10. The RF power amplifier package according to claim 9, further comprising a conductive substrate on which the semiconductor die is mounted,
wherein the input matching capacitor is mounted on the conductive substrate,
wherein the grounded second terminal of the input matching capacitor is preferably connected to the conductive substrate, and
wherein the ground terminal of the RF power transistor is preferably connected to a substrate via the conductive substrate of the semiconductor die.

11. The RF power amplifier package according to claim 1, further comprising:
a DC blocking capacitor having a first terminal and a second grounded terminal; and
one or more resonance bondwires connected in between the plurality of output bond pads and the first terminal of the DC blocking capacitor,
wherein the DC blocking capacitor essentially forms a short at an RF operating frequency of the RF power amplifier package,
wherein an inductance of the one or more resonance bondwires is designed such that it resonates with an output capacitance of the RF power transistor at or close to the RF operating frequency, and
wherein the DC blocking capacitor is preferably arranged on a separate semiconductor die in between the semiconductor die and the output lead or on the semiconductor die.

12. The RF power amplifier package according to claim 11, wherein the DC blocking capacitor is arranged on the semiconductor die, and wherein:
the DC blocking capacitor is arranged nearer to an edge of the semiconductor die that is closest to the input side of the RF power amplifier package and wherein each output finger of the plurality of output fingers physically extends for a larger part in the region in between the input side of the RF power amplifier package and the plurality of output bond pads than in the region in between the plurality of output bond pads and the output side of the RF power amplifier package; or
the DC blocking capacitor is arranged nearer to an edge of the semiconductor die that is closest to the output side of the RF power amplifier package and wherein each output finger of the plurality of output fingers physically extends for a larger part in the region in between the plurality of output bond pads and the output side of the RF power amplifier package than in the region in between the input side of the RF power amplifier package and the plurality of output bond pads.

13. The RF power amplifier package according to claim 11, further comprising a conductive substrate on which the semiconductor die is mounted,
wherein the DC blocking capacitor is mounted on the conductive substrate,
wherein the second grounded terminal of the DC blocking capacitor is preferably connected to the conductive substrate, and
wherein the ground terminal of the RF power transistor is preferably connected to a substrate via the conductive substrate of the semiconductor die.

14. The RF power amplifier package according to claim 1, wherein the first bondwire connections connect directly to the input lead.

15. The RF power amplifier package according to claim 1, wherein the second bondwire connections connect directly to the output lead.

16. The RF power amplifier package according to claim 1,
wherein the RF power transistor comprises a RF power field-effect transistor (FET), and
wherein a input of the RF power transistor corresponds to a gate of the RF power FET, an output of the RF power transistor corresponds to a drain of the RF power FET, and the ground terminal of the RF power transistor corresponds to a source of the RF power FET.

17. An electronic device comprising the RF power amplifier package according to claim 1.

* * * * *